United States Patent [19]

Karlsson et al.

[11] 4,442,492
[45] Apr. 10, 1984

[54] DEVICE FOR CENTRAL READING AND REGISTRATION OF CUSTOMERS' POWER CONSUMPTION

[76] Inventors: Björn G. E. Karlsson, Fyrklöversgatan 125, Nödinge, Sweden, 440 45; Ingvar Jönson, Slottervallsgatan 9, Mölndal, Sweden, 431 40

[21] Appl. No.: 255,240
[22] PCT Filed: Aug. 20, 1980
[86] PCT No.: PCT/SE80/00213
   § 371 Date: Apr. 17, 1981
   § 102(e) Date: Apr. 17, 1981
[87] PCT Pub. No.: WO81/00619
   PCT Pub. Date: Mar. 5, 1981

[30] Foreign Application Priority Data

Aug. 21, 1979 [SE] Sweden ................ 7906983

[51] Int. Cl.³ ............. G01R 21/06; G06F 15/20
[52] U.S. Cl. .................. 364/464; 324/142; 340/870.02
[58] Field of Search ............ 364/481, 483, 464; 340/870.01, 870.02, 870.04, 825.26, 825.41; 235/92 EL; 324/142; 377/14, 19

[56] References Cited

U.S. PATENT DOCUMENTS

| | | | |
|---|---|---|---|
| 3,683,343 | 8/1972 | Feldman | 340/870.02 |
| 3,747,068 | 7/1973 | Bruner et al. | 364/483 |
| 4,075,699 | 2/1978 | Schneider et al. | 364/492 |
| 4,080,568 | 3/1978 | Funk | 364/464 |
| 4,106,095 | 8/1978 | Yarbrough | 364/464 |
| 4,207,557 | 6/1980 | Gilkeson et al. | 364/464 |
| 4,218,737 | 8/1980 | Buscher et al. | 364/493 |
| 4,241,237 | 12/1980 | Paraskevakus et al. | 340/825.26 |
| 4,291,375 | 9/1981 | Wolf | 364/483 |

Primary Examiner—Errol A. Krass
Attorney, Agent, or Firm—Holman & Stern

[57] ABSTRACT

A device is disclosed for central and automatic reading, registration and control of energy consumption meters located at consumer locations. The communiction between producer and consumer is made through codified signals, which by way of a modem are superposed on the line voltage of the power distribution network. Thus the charge per unit energy consumed can be easily changed from one time to another. The change can therefore always and effectively be related to the cost of production for the energy, and thus a more equitable charging system can be created, which promotes saving of energy.

3 Claims, 2 Drawing Figures

DEVICE FOR CENTRAL READING AND REGISTRATION OF CUSTOMERS' POWER CONSUMPTION

TECHNICAL FIELD

The present invention refers to a device for central and automatic reading and registration for a consumer's, or a group of consumers', consumption of e.g. electricity, water, gas, heat etc. through the power distribution network. The convention comprises a central unit receiving information from one or more addressable consumer locations, each comprising a sensor for each form of consumption, the measuring data of said sensor being fed to a micro-computer to be stored, said micro-computer being connected to the central unit, said device further comprising means for identifying address and command codes transmitted from the central unit.

BACKGROUND OF THE INVENTION

The actual cost for producing electric energy varies very strongly between tenths of one Swedish öre (1 Skr=100 öre) per KwH during the spring flood and night time and 15–20 öre per kwh during periods of high demand and dry years. Today the consumer is charged a fixed energy price during the whole year based on the long-term marginal cost calculated from a co-ordination of all electric energy producers of the country. This pricing is not based on the actual cost, but it has hitherto been the only possible realistic pricing system.

A condition for a pricing system which charges the consumer the actual instantaneous energy cost is however a communication system between the distributor and the consumer of electric energy. Modern computer technique has made central and automatic reading and registration of a consumer's consumption possible whereby the ordinary distribution line between the electric power station and the consumer is used as a communication medium.

SUMMARY OF THE INVENTION

An object of the present invention is to provide a device for more accurate billing of electric energy consumption to improve the possibility for optimal utilization of electric energy when it is cheapest and which therefore appeals to the economy of the consumers. A further object is to considerably simplify and automatate central reading and registration of the energy consumed. These objects have been accomplished by arranging the central unit to automatically perform alteration of billings at the consumer locations by means of control signals, said consumer locations being provided with at least one indication unit for indicating the present energy cost, and by possibly indicating the instantaneous power consumption and/or flow and the accumulated consumption indicated in monetary units and/or energy units.

DESCRIPTION OF EMBODIMENTS

Figure 1:
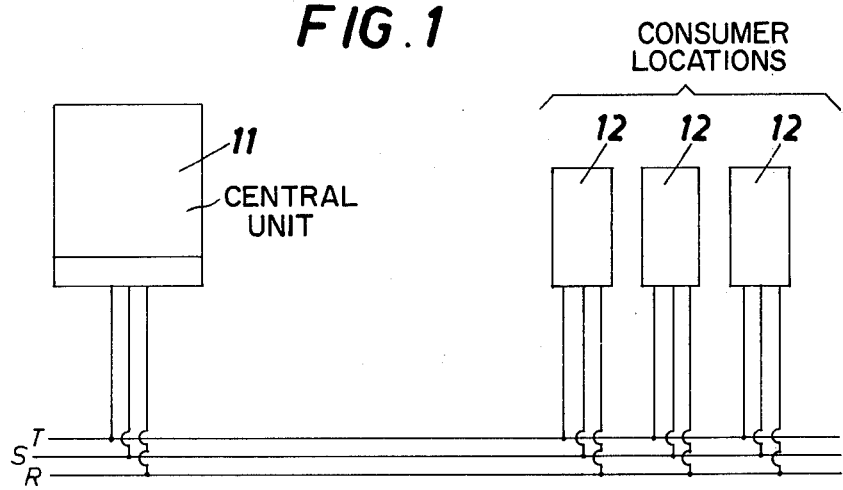
FIG. 1 is a block diagram of a power distribution network between a central unit and a number of consumer locations and FIG. 2 is a block diagram of the main parts of a consumer location.

In FIG. 1 there is shown a power distribution network including three phases R, S, T and possibly a neutral wire (not shown). To the power distribution network there is connected a central unit 11, comprising a computer located at the electric energy distributor or producer, and a great number of consumer locations 12, which can be domestic consumers or heavy consumers such as industries, workshops etc. If the three-phase voltage has to be transformed, by-pass means are preferably arranged at the transformer stations, said by-pass means comprising, e.g., optically transmitting codified signal messages on the three-phase line past the transformer station. The computer located in the central unit 11 sends out digital, preferably binary, control signals to all consumer locations 12 by way of the power distribution network. The control signals preferably comprise an address part and a command part indicated by a micro-computer 13 (FIG. 2) arranged in the consumer location 12. When the address part coincides with the identification code of the consumer location, which is stored in a memory 14, the micro-computer will decode the command part of the control signal. Said command part can e.g. consist of the command: "read the accumulated consumption since the last reading in the memory 15 and send the information back to the central unit 11 codified together with an identification code".

Another command from the central unit 11 can involve an increase of charges at the consumer location 12, which changes the contents in e.g. the memory 16.

The device according to the invention is adapted for central and automatic reading, registration and charge control not only of the consumption of electricity but also for water, gas, heat etc. The device can for this purpose be provided with sensors 17, 18 and 19, of which the sensor 17 in this embodiment comprises an electronic electricity meter, which transmits to the memory 15 the integrated consumption during a unit of time. The memories 14, 15 and 16 are of such a kind that a voltage drop will not cause an erasure of the contents in the memories. This is accomplished by means of EAROM (electrically alterable read-only memory) for the memories actuated by the micro-computer. The memory for the identification code is achieved e.g. by electronic circuits or by a pre-programmed ROM.

Figure 2:
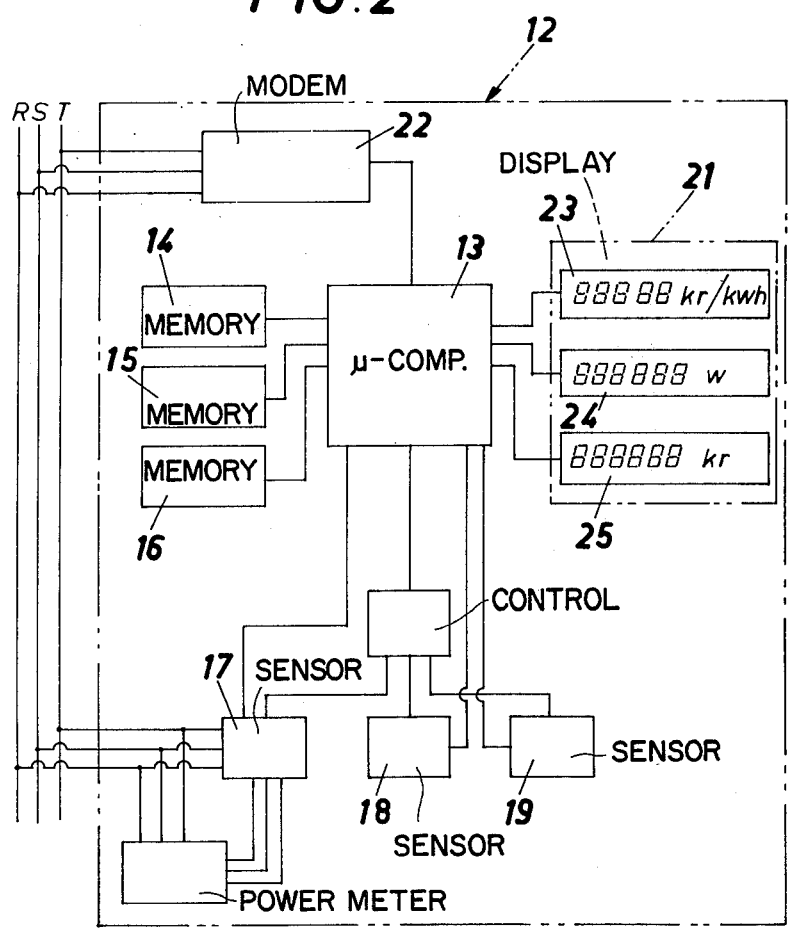

The block diagram of FIG. 2 only shows the essential main portions of the invention and the micro-computer does of course contain a number of memories for programs, intermediate storing of results etc. beside the memories shown.

The electronic sensor 17 comprises the same number of transmitter elements as the number of phases in the power distribution network, at which every transmitter element has the same function as a conventional electricity meter. Such transmitters can also consist of Hall elements if the active power consumption (watt) is to be measured as in conventional electricity meters, but a much more simple signal transmission to the micro-computer 13 is achieved if the current outlet is measured instead.

Through the program in the micro-computer 13 the sensors and the memories are read at times determined by the crystal-controlled clock of the computer. The restored data can be read on an indication table 21 located at the consumer location. Between the micro-computer 13 and the power distribution network a communication unit 22 is arranged, which comprises e.g. a modulator/demodulator, a so called modem, in which the data signals are decoded and insulated from the line voltage and transmitted to the micro-computer. Data from the consumer can also by order from the computer of the central unit, be sent back to the computer of the central unit 11 by way of the power distribution network.

The indication table 21, which is placed at a visible place at every consumer station, comprises a number of displays 23, 24 and 25 (e.g. of LED-type) indicating different functions. The display 23 indicates e.g. the present electric energy price in Skr/kwh. The price can vary from to night, in accordance with the season and the year, etc., as previously mentioned. The display 24 indicates the power consumption in watt units and the display 25 indicates the accumulated energy cost in, e.g. Skr, since the last reading.

By the fact that the electric energy producer, by means of control signals routed over the power distribution network, can charge the consumer in relation to the instantaneous cost of production, a more correct billing is achieved and the possibilities for optimal utilization of the resources by the producers, distributers as well as by the consumers are improved. By knowing the change of the enerby price during the night and day and during the year it is possible to for economic reasons alter the time for such activities that are not continuous. For households, such activities as washing, drying of washing, dish-washing, accumulation of heat etc., can be performing during the period, e.g. the night, when the energy price is low. By always being aware of the energy cost the consumer is given cause to save in a quite different way than with today's electricity meters which only indicate the energy consumed. By always being aware of the power consumption in watt units for different machines or activities a cost-conciousness is raised, which can result in a considerable saving of energy, if such activities as opening of windows, sauna bathing, switching on kitchen fans, hot-air chambers etc. are reduced to a minimum. By the device according to the invention it is thus possible to create opportunities for a remote reading, which reduces the personnel required and further lowers the energy costs.

We claim:

1. A system for automatically reading and registering at a central location the consumption of a meterable quantity at least at one remote consumer location, wherein electric power distribution lines extend through said central and consumer location, said system comprising:

at said at least one consumer location:
    modulator-demodulator means connected to said power distribution lines for receiving control signals from and transmitting data signals to said central location via said power distribution lines;
    sensor means for measuring consumption of said meterable quantity at said each consumer location;
    storage means for storing a selectively modifiable current billing rate charged for consumption of said meterable quantity;
    means responsive to reception of a first predetermined control signal at said modulator-demodulator means for changing the current billing rate stored in said storage means;
    accumulator means for accumulating data representing the amount of said meterable quantity measured at said sensor means;
    means responsive to reception of a second predetermined control signal at said modulator-demodulator means for transmitting via said power distribution lines data signals representing the accumulated data in said accumulator means and for resetting the accumulator means; and
    indicator means for providing an indication of the current billing rate stored in said storage means;

at said central location:
    means for selectively transmitting said first and second predetermined control signals to said consumer location via said power distribution lines; and
    means for receiving data signals transmitting from said consumer location via said power distribution lines.

2. The system according to claim 1 further comprising, at said consumer location, further indicator means for providing an indication of the instantaneous consumption of said meterable quantity measured at said sensor means.

3. The system according to claim 1 further comprising, at said consumer location:
    means for computing the accumulated charges at said consumer location of said meterable quantity; and
    additional indicator means for providing an indication of said accumulated charges.

* * * * *